United States Patent [19]
Kitakubo et al.

[11] Patent Number: 5,731,964
[45] Date of Patent: Mar. 24, 1998

[54] ELECTROMAGNETIC-WAVE SHIELDING DEVICE

[75] Inventors: Kazuto Kitakubo, Tokyo; Takeshi Sugiyama, Chiba, both of Japan

[73] Assignee: Sony Corporation, Tokyo, Japan

[21] Appl. No.: 645,583

[22] Filed: May 14, 1996

[30] Foreign Application Priority Data

May 23, 1995 [JP] Japan .................... 7-123268

[51] Int. Cl.⁶ ........................................ H05K 9/00
[52] U.S. Cl. .................. 361/816; 174/35 R; 361/752; 361/753; 455/90; 455/117
[58] Field of Search .......................... 361/724, 725, 361/730, 736, 753, 799, 800, 816, 818, 752; 174/35 R, 35 GC; 455/90, 97, 128, 129, 300, 271, 278.1, 296, 347, 117

[56] References Cited

U.S. PATENT DOCUMENTS

| | | | |
|---|---|---|---|
| 3,258,649 | 6/1966 | Arguin et al. | 361/424 |
| 4,890,199 | 12/1989 | Beutler | 361/424 |
| 5,383,098 | 1/1995 | Ma et al. | 361/818 |
| 5,564,083 | 10/1996 | Lee et al. | 455/90 |

*Primary Examiner*—Kristine L. Kincaid
*Assistant Examiner*—Hung V. Ngo
*Attorney, Agent, or Firm*—Jay H. Maioli

[57] ABSTRACT

An electromagnetic-wave shielding device for shielding unnecessary electromagnetic radiation by covering a printed circuit board which generates electromagnetic waves, by a pair of box-like upper and lower shielding cases integrally connected to each other, include an engaged portion provided at a lower shielding case, an engaging portion provided at an upper shielding case of the shielding case pair and engaging with and disengaging from the engaged portion, and pillar-shaped portions being projected from opposing portions of the shielding cases for holding the board between the pillar-shaped portions when the engaged portion of the lower shielding case engages with the engaging portion of the upper shielding case. The printed circuit board held between the pillar-shaped portions is detachably accommodated in the shielding case pair, except for a connect for receiving external signals.

3 Claims, 6 Drawing Sheets

ELECTROMAGNETIC-WAVE SHIELDING DEVICE

BACKGROUND OF THE INVENTION

1. Field of the Invention

The present invention relates to an electromagnetic-wave shielding device which is able to shield harmful electromagnetic waves resulting from unnecessary electromagnetic radiation of high-frequency waves and is suitable for a portable telephone or the like.

2. Description of the Prior Art

For example, in portable systems, such as a portable telephone, a cordless-type telephone, a transceiver or the like, which have accommodated therein a printed circuit board having a circuit which generates high-frequency waves (generally corresponding to electrical signals of frequencies of 30 KHz or more in alternating-current electrical signals for use in signal communication), it is necessary to electromagnetically shield the printed circuit board equipped with the above-noted high-frequency generating circuit, for the purpose of preventing unnecessary electromagnetic radiation of high-frequency waves serving as harmful electromagnetic waves and of isolating the printed circuit board equipped with the high-frequency generating circuit from a circuit mounted on the other printed circuit board. Usually, a variety of electronic components such as integrated circuit chips, constructing a high-frequency generating circuit, are mounted on a printed circuit board. Electromagnetic shielding is obtained by enclosing the printed circuit board by a box-like conductive shielding case (having a conductivity). In order to ensure better shielding effect, the prior art device requires soldering side walls of the shielding case onto the printed circuit board, when enclosing the printed circuit board by the box-like shielding case.

However, in the conventional method according to which the shielding case is soldered onto the printed circuit board, there is the problem that the man-hour for assembling a portable system tends to be increased and another problem of uneasy disassembly of the system during maintenance.

Figure 8:
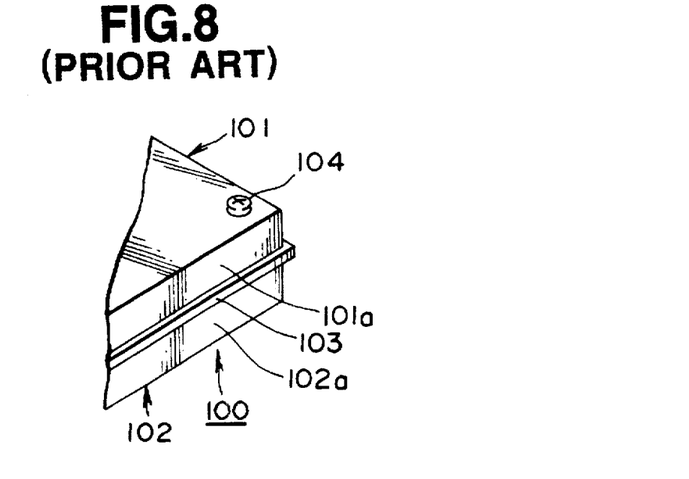
FIG. 8 is a partial perspective view illustrating a conventional electromagnetic-wave shielding device.
Figure 9:
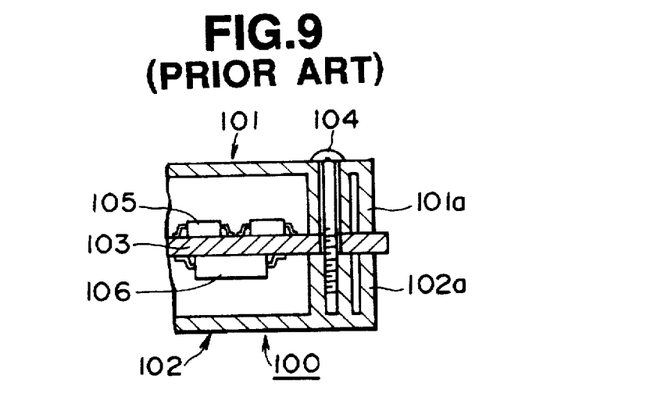
FIG. 9 is a cross-sectional view illustrating the above-noted conventional electromagnetic-wave shielding device, partly sectioned.

For the reasons set forth above, an electromagnetic-wave shielding device 100 shown in FIGS. 8 and 9 is put to practical use. Herebelow described in detail in accordance with the drawings, the electromagnetic-wave shielding device 100 is applied to a portable telephone or the like, and comprised of a pair of upper and lower box-like conductive shielding cases 101, 102, and a printed circuit board 103 which board is hermetically covered by way of the pair of upper and lower shielding cases 101 and 102.

Figure 10:
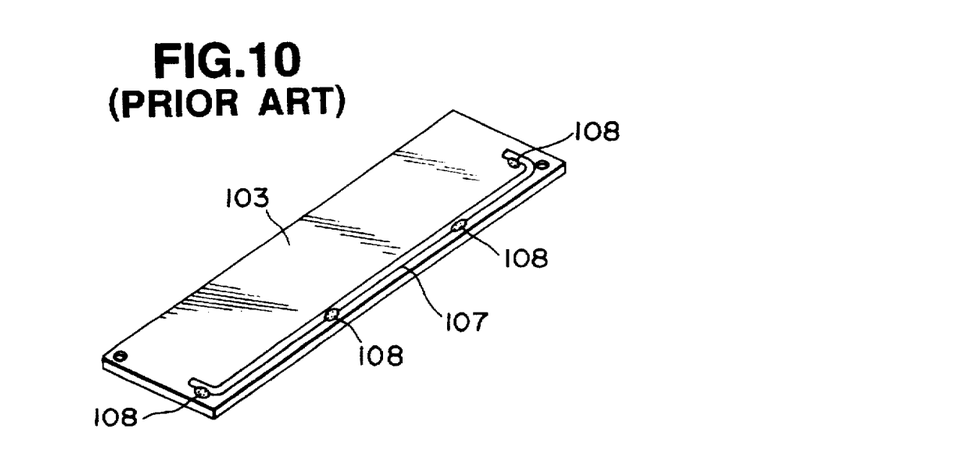
FIG. 10 is a perspective view illustrating a printed circuit board incorporated in the above-mentioned conventional electromagnetic-wave shielding device.

As shown in FIGS. 8 and 9, the pair of upper and lower shielding cases 101 and 102 are firmly secured or fixed to the printed circuit board 103 by means of screws 104 in a manner so as to hold therebetween the perimeter of the latter, thus ensuring easy assembling and disassembling. As shown in FIG. 9, a variety of electronic components 105 and 106, for example composed of integrated circuit chips constructing a high-frequency generating circuit, are mounted on the printed circuit board 103. As indicated in FIG. 10, for the purpose of efficiently transmitting high-frequency signals produced by the above-noted high-frequency generating circuit to an antenna, a semi-rigid coaxial cable 107 is wired on the printed circuit board 103 in view of easy assembling and of the high shielding effect. The semi-rigid coaxial cable 107 was fixed to the printed circuit board 103 by soldering several portions of the cable to the board (the soldered portions are indicated by reference sign 108).

However, the prior art electromagnetic-wave shielding device 100 has a problem of an unsatisfactory shielding effect, since respective side walls 101a and 102a of the pair of upper and lower shielding cases 101 and 102 are separated from each other by the printed circuit board 103 and thus it is difficult to certainly absorb and shield unnecessary radiation of the high-frequency waves produced by the printed circuit board 103. Additionally, the perimeter of the printed circuit board 103 is designed to extend outside of the pair of upper and lower shielding cases 101 and 102, and therefore electronic parts cannot be mounted on the perimeter of the printed circuit board 103. Thus, there is a further problem that the entire size of the system is large and, therefore a wider actual mounting area necessary to mount electronic parts must be provided.

SUMMARY OF THE INVENTION

It is, therefore, an object of the present invention to provide a portable electromagnetic-wave shielding device which is capable of ensuring easy assembling and disassembling and providing a superior shielding effect.

In order to accomplish the aforementioned and other objects of the invention, an electromagnetic-wave shielding device for shielding unnecessary radiation of electromagnetic waves by covering a printed circuit board which generates the electromagnetic waves, by a pair of box-like shielding cases, comprises an engaged portion provided at one shielding case of the pair of shielding cases, an engaging portion provided at the other shielding case of the pair of shielding cases and engaging with and disengaging from the engaged portion, and pillar-shaped portions being projected from opposing portions of the shielding cases for holding the printed circuit board between the pillar-shaped portions when the engaged portion of the one shielding case engages with the engaging portion of the other shielding case. The printed circuit board, which is held between the pillar-shaped portions, is detachably accommodated in the pair of shielding cases, except for a part connected to external electrical parts.

When the engaged portion of the one shielding case is engaged with the engaging portion of the other shielding case, the printed circuit board is accommodated in the pair of shielding cases, except for a part connected to external electrical parts, while being held between the pillar-shaped portions of the pair of shielding cases. For the reasons set out above, undesired radiation of electromagnetic waves generated by the above-mentioned printed circuit board can be certainly absorbed and shielded in the pair of shielding cases.

DESCRIPTION OF THE PREFERRED EMBODIMENTS

The present invention will be hereinbelow described in detail on the basis of the embodiment shown in the drawings.

Figure 1:
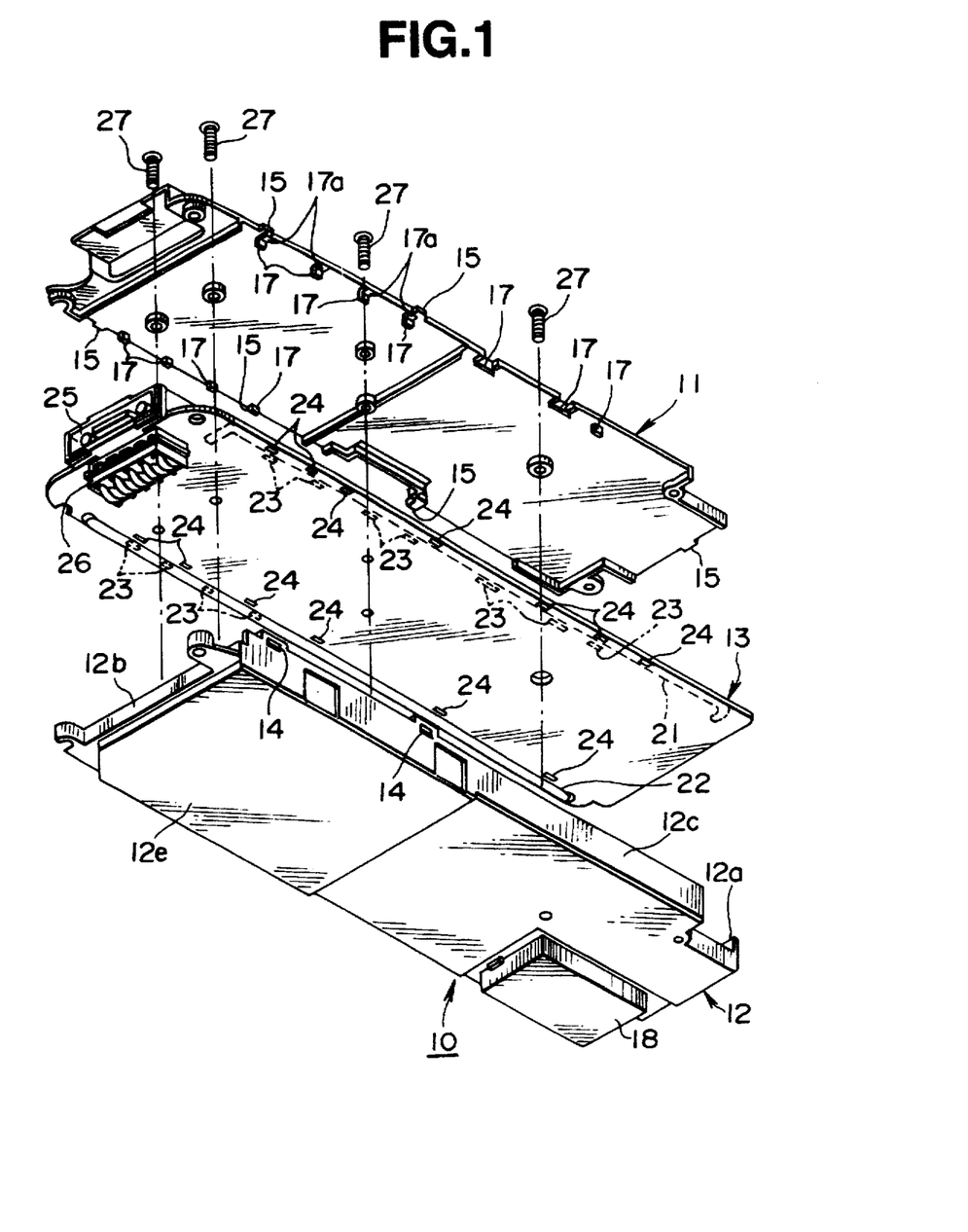
FIG. 1 is a dis-assembled perspective view illustrating the electromagnetic-wave shielding device of an embodiment of the invention, exemplified in case of a portable telephone.
Figure 5:
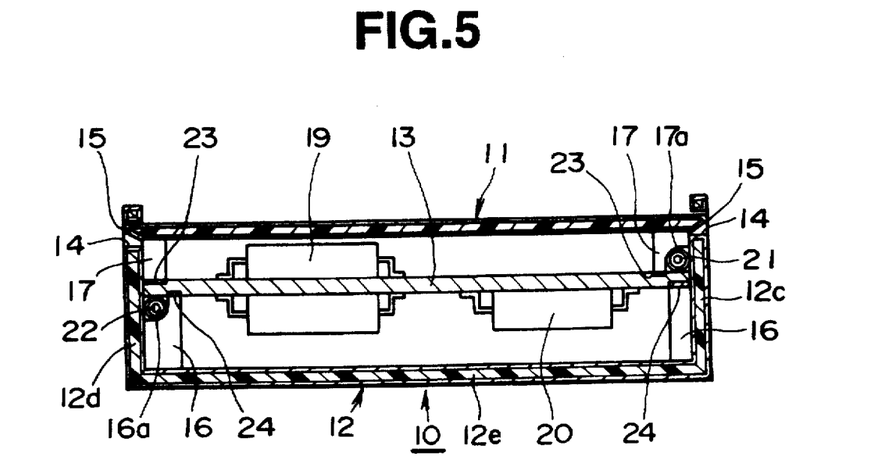
FIG. 5 is a cross-sectional view illustrating the above-noted electromagnetic-wave shielding device.
Figure 6:
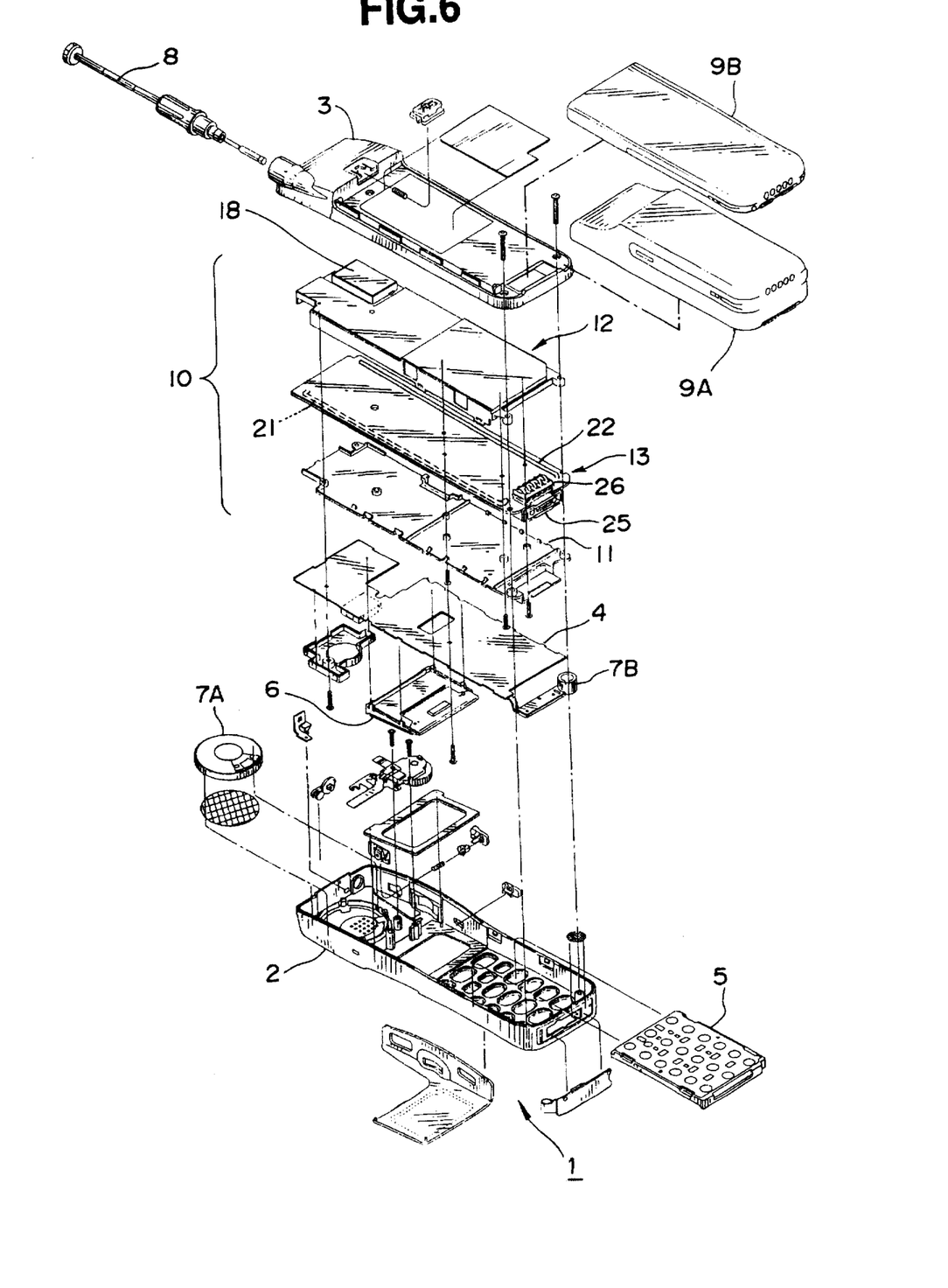
FIG. 6 is a dis-assembled perspective view illustrating a portable telephone equipped with the above-noted electromagnetic-wave shielding device.

In FIGS. 1 and 5, reference numeral 10 denotes an electromagnetic-wave shielding device being built-in between upper and lower cases 2 and 3 which cases are formed of synthetic resin and included in a portable telephone 1 shown in FIG. 6. The electromagnetic-wave shielding device 10 is mainly comprised of a pair of upper and lower box-like conductive shielding cases 11 and 12 (having a conductivity), and a rectangular printed circuit board 13 which board is hermetically covered by the pair of upper and lower shielding cases 11 and 12.

Figure 2:
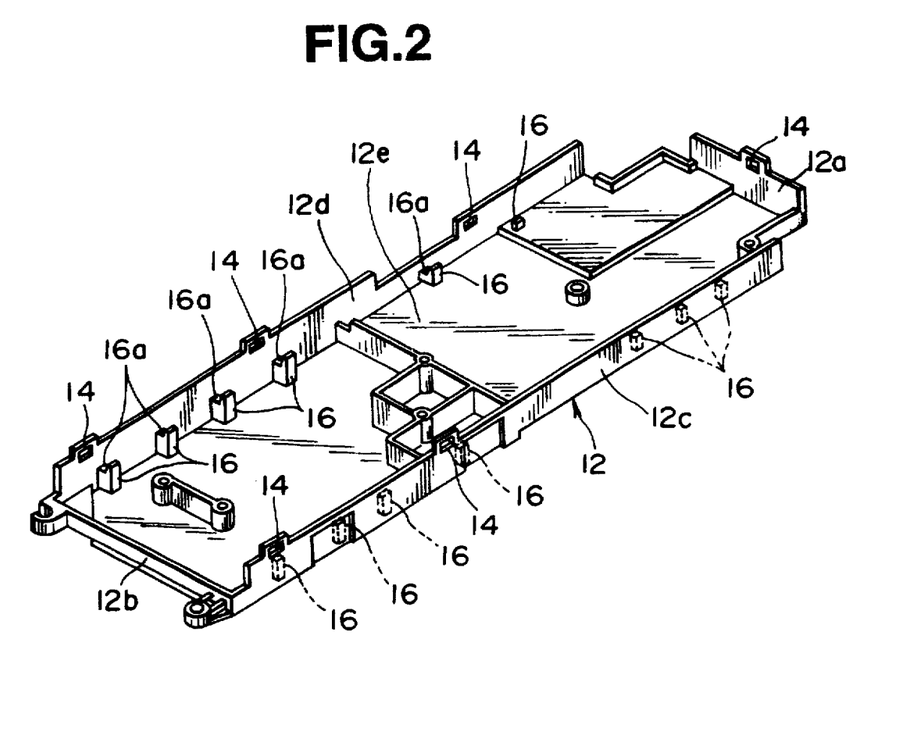
FIG. 2 is a perspective view illustrating the lower shielding case incorporated in the above-noted electromagnetic-wave shielding device.
Figure 3:
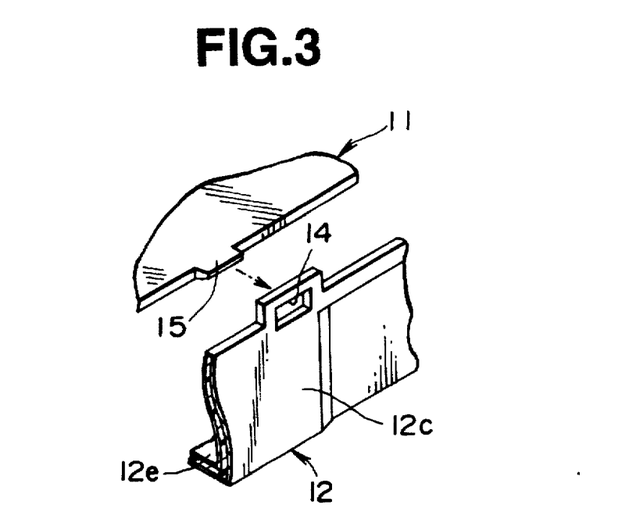
FIG. 3 is a perspective view illustrating a state before the pair of upper and lower shielding cases incorporated in the above-mentioned electromagnetic-wave shielding device are fitted to each other, partially enlarged.
Figure 4:
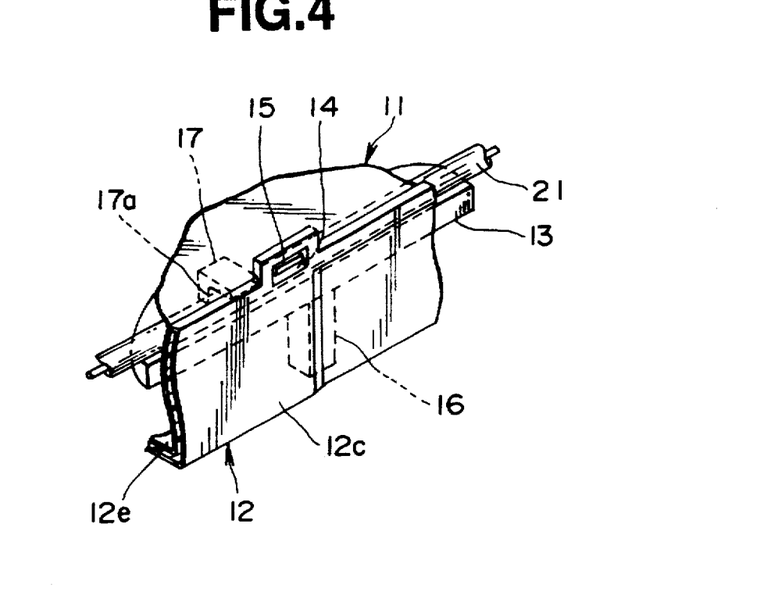
FIG. 4 is a partially enlarged perspective view illustrating a fitted state in which the pair of upper and lower shielding cases incorporated in the above-mentioned electromagnetic-wave shielding device are fitted to each other.

As shown in FIGS. 1 and 5, the upper shielding case 11 is formed into a substantially rectangular plate shape in such a manner that the metal-plating is made to cover all over the surface of a rectangular synthetic-resin plate. As shown in FIGS. 2 and 5, the lower shielding case 12 is formed into a box-like shape by metal-plating a synthetic-resin material so that its upper face is opened and so that the lower shielding case 12 is designed and dimensioned to fully enclose and accommodate the perimeter of the above-noted printed circuit board 13 between the front and rear walls 12a and 12b and between both side walls 12c and 12d. Provided at the opening-end side of the lower shielding case 12 (corresponding to the one shielding case) and in the front wall 12a and both side walls 12c and 12d are six rectangular engaged slots (engaged portions) 14. Edges of the upper shielding case 11 (corresponding to the other shielding case), which oppose the respective engaged slots 14, are integrally formed with nailed portions 15 (the engaging portions) which are engageable with and disengageable from the respective engaged slots (engaged portions) 14 and each of which has an inclined face at the bottom side. Thus, as indicated in FIG. 5, when the nailed portions 15 of the upper shielding case 11 are engaged with the respective engaged slots 14 of the lower shielding case 12, the upper shielding case 11 is engaged with the lower shielding case between the front wall 12a and both side walls and thus being formed into a box-like shape. With the pair of shielding cases 11 and 12 formed into the box-like shape, the above-noted printed circuit board 13 can be accommodated therein.

A plurality of quadrangular prism-like pillar-shaped portions 16 are integrally formed on the lower shielding case 12 in spaced relationship with each other by predetermined distances so that the pillar-shaped portions vertically and upwardly project from both ends of the inside wall surface of the bottom wall 12e to the middle of the respective inside wall surfaces of both side walls 12c and 12d. On the other hand, a plurality of quadrangular prism-like pillar-shaped portions 17 are integrally formed in spaced relationship with each other on both side ends of the upper shielding case 11, which side ends oppose the respective inside wall surfaces of both side walls 12c and 12d, in a manner so as to vertically and downwardly project and to hold the above-noted printed circuit board 13 in conjunction with the respective pillar-shaped portions 16. Of the opposing pairs of the pillar-shaped portions 16 and 17, some pair is an opposing pair that the pillar-shaped portion 16 opposes the corresponding pillar-shaped portion 17 in an identical position, while the remaining pair is an opposing pair that the pillar-shaped portion 16 does not oppose the corresponding pillar-shaped portion 17 in an identical position. As seen in FIG. 2. The respective pillar-shaped portions 16, facing the left-hand side wall 12d of the lower shielding case 12, are formed with cut-outs 16a at their points. As seen in FIG. 1, the respective right-hand pillar-shaped portions 17 are formed with cut-outs 17a at their points. As indicated in FIG. 1, a built-in antenna 18 is mounted on the outside wall surface of the bottom wall 12e of the lower shielding case 12 at one corner in the vicinity of the front wall 12a.

As shown in FIG. 5, a variety of electronic components 19 and 20 containing integrated circuit chips which construct a high-frequency generating circuit, are mounted on the upper and lower faces of the printed circuit board 13. As seen in FIGS. 1 and 5, wired at the right-hand end of the upper face of the printed circuit board 13 and at the left-hand end of the lower face of the printed circuit board, are a pair of semi-rigid coaxial cables 21 and 22 for the purpose of efficiently transmitting high-frequency signals from the above-mentioned high-frequency generating circuit to the antenna 8 of the portable telephone 1 shown in FIG. 6. Each of the pair of semi-rigid coaxial cables 21 and 22 is fixed onto the printed circuit board 13 by soldering only its ends. The intermediate portions of the pair of semi-rigid coaxial cables 21 and 22 are arranged to be fixed on the printed circuit board 13 by virtue of the cut-outs 17a of the right-hand pillar-shaped portions 17 of the upper shielding case 11, the cut-outs 16a of the left-hand pillar-shaped portions 16 of the lower shielding case 12, and the two side walls 12c and 12d of the lower shielding case 12.

Furthermore, as seen in FIGS. 1 and 5, ground terminals 23 and 24 are respectively provided at an abutment portion in which top ends of the pillar-shaped portions 17 of the upper shielding case 11 abut the upper face of the printed circuit board 13 and at an abutment portion in which top ends of the pillar-shaped portions 16 of the lower shielding case 12 abut the lower face of the printed circuit board. Additionally, as seen in FIGS. 1 and 6, mounted on the upper and lower faces of the printed circuit board 13 at the rear end thereof are an external connection terminal 25 and a battery input terminal 26.

The pair of upper and lower shielding cases 11 and 12, accommodating therein the printed circuit board 13, are so designed to be securely fastened to each other by means of a plurality of screws 27. As seen in FIG. 6, interleaved between the upper shielding case 11 and the upper case 2 of the portable telephone 1 is a printed circuit board 4 on which a key button 5, a liquid-crystal display unit 6 (abbreviated LCD unit), a speaker 7A and a microphone 7B are mounted. Also, the antenna 8 is mounted on the front section of the lower case 3 of the portable telephone 1. Additionally, detachably installed on the bottom face of the lower case 3 are a larger-sized battery 9A and a smaller-sized battery 9B whose capacities are different from each other.

In the electromagnetic-wave shielding device 10 of the embodiment as set out above, when assembling the portable telephone 1, edges of both sides of the printed circuit board 13 with the high-frequency generating circuit are first of all fitted and inserted onto the upper face of the lower shielding case 12 between the two side walls 12c and 12d of the lower shielding case, with the result that the printed circuit board is put on the ends of the respective pillar-shaped portions 16 projected along both side walls 12c and 12d. Next, the nailed portions 15 of the upper shielding case 11 are fitted into the respective engaged slots 14 formed at the walls 12a, 12c, and 12d of the lower shielding case 12, with the result that the printed circuit board 13 is sandwiched and held between the pillar-shaped portions 17 and 16 of the pair of upper and lower shielding cases 11 and 12, and thus the printed circuit board is accommodated within the pair of shielding cases 11 and 12, except a part connected to the external electrical parts. During assembling, as shown in FIG. 5, the ends of the pillar-shaped portions 17 and the ends of the pillar-shaped portions 16 are brought into contact with the respective ground terminals 23 and 24 of the printed circuit board 13, and additionally the intermediate portions of the semi-rigid coaxial cables 21 and 22 are certainly fixed onto the printed circuit board 13 between the cut-outs 17a of the pillar-shaped portions 17 and the inside wall surface of the side wall 12c and between the cut-outs 16a of the pillar-shaped portions 16 and inside wall surface of the side wall 12d. Thereafter, the above- noted pair of shielding cases 11 and 12, which accommodate therebetween the printed circuit board 13, are securely fastened to each other by means of a plurality of screws 27, and in this manner the electromagnetic-wave shielding device 10 can be easily assembled.

As set forth above, the printed circuit board 13 with the high-frequency generating circuit can be so accommodated to be wrapped in the box-like shielding case pair 11 and 12, and thus a good shielding effect can be obtained by certainly absorbing any unnecessary radiation waves of the high-frequency waves serving as harmful electromagnetic waves when the electromagnetic-wave shielding device of the embodiment is applied to the portable telephone 1, and also a proper isolation can be attained between the high-frequency generating circuit mounted on the printed circuit board 13 and circuits mounted on the printed circuit board 4 of the portable telephone 1. Almost all space of the perimeter of the printed circuit board 13 except the abutment portions abutting with the pillar-shaped portions 16 and 17, can be effectively utilized as an actual mounting area for electronic components 19 and 20, thus ensuring the entire size of the electromagnetic-wave shielding device to be small-sized. Additionally, since the pair of shielding cases 11 and 12 are formed by metal-plating synthetic resin, as a whole, the electromagnetic-wave shielding device 10 can be light-weight.

By way of a simple assembling work according to which the nailed portions 15 formed on the edges of both side ends of the upper shielding case 11 are fitted into the respective engaged slots 14 formed at the side walls 12c and 12d of the lower shielding case 12, the printed circuit board 13 can be accommodated in such a manner as to be held between the pillar-shaped portions 17 and 16 of the pair of shielding cases 11 and 12. As a consequence, easy assembly work can be ensured, thus enhancing productivity. In addition to the above, at the same time when the pair of shielding cases 11 and 12 are assembled to each other, the semi-rigid coaxial cables 21 and 22 can be fixed onto the printed circuit board 13, and thus eliminating the need for the soldering work of the prior art device according to which intermediate portions of the semi-rigid coaxial cables 21 and 22 are fixed to the printed circuit board 13 by soldering. In view of this, assembling man-hours can be reduced, thereby remarkably enhancing productivity. Moreover, the electromagnetic-wave shielding device 10 can be easily dis-assembled only by loosening the fastening screws 27, thus ensuring easy repair.

Figure 7A:
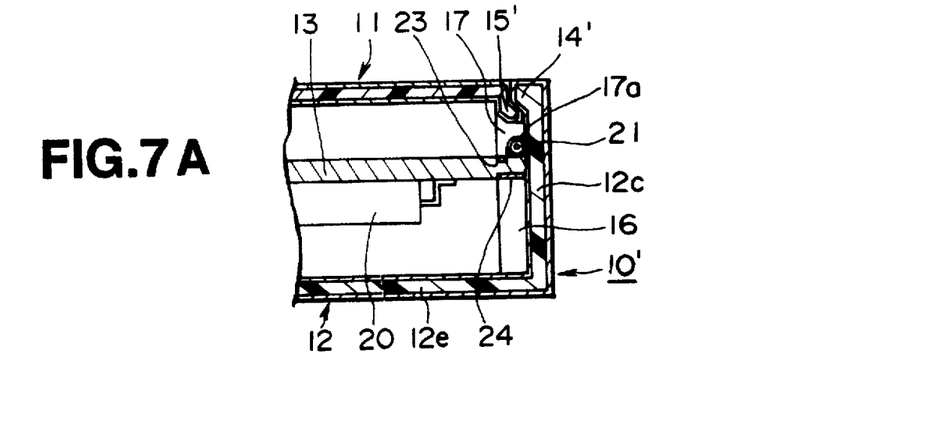
FIG. 7(a) is a partial cross-sectional view illustrating a fitted state of a pair of upper and lower shielding cases incorporated in an electromagnetic-wave shielding device of another embodiment.
Figure 7B:
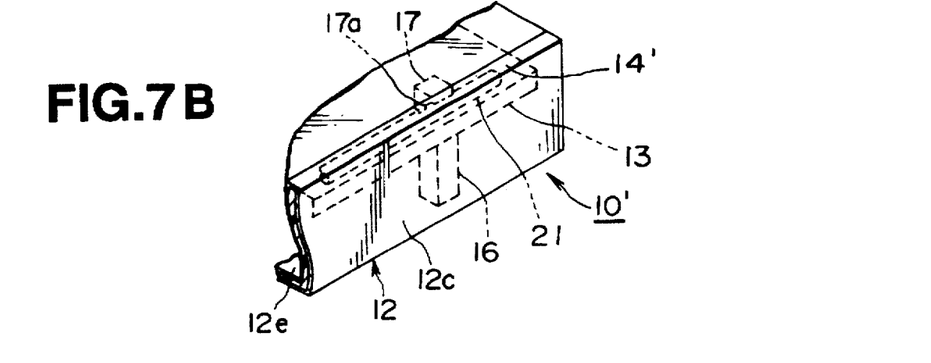
FIG. 7(b) is a partial perspective view illustrating the above-noted fitted state.
Figure 7C:
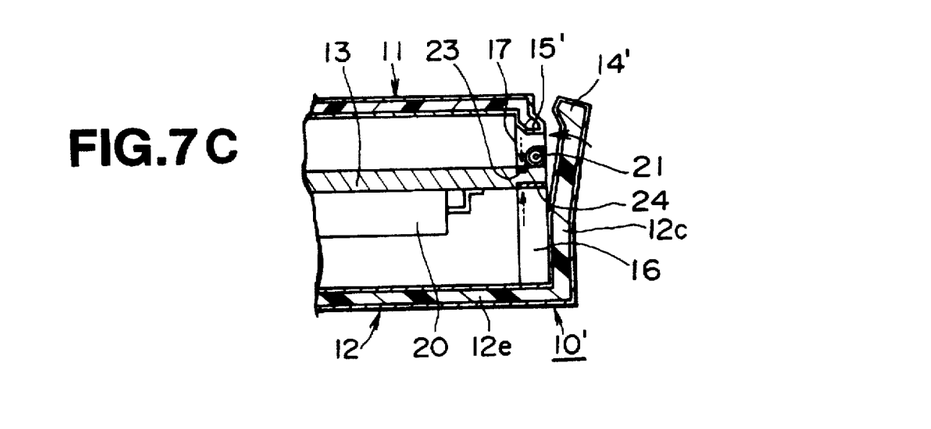
FIG. 7(c) is an explanatory view illustrating the above-noted fitted state.

Referring to FIG. 7, there is shown the other embodiment of an electromagnetic-wave shielding device 10'. Integrally formed at the respective upper edges of the two side walls 12c and 12d (partially omitted with regard to the side wall 12d for the sake of illustrative simplicity) of the lower shielding case 12 of the 5 electromagnetic-wave shielding device 10', are engaged portions 14' each having its inner inclined wall surface inclined with respect to the inside wall of its associated side wall 12c or 12d, in such a manner that the engaged portions are projected inwardly from the side walls. On the other hand, integrally formed at the edges of both side ends of the upper shielding case 11 are engaging portions 15' each having its outer inclined wall surface outwardly inclined with respect to the associated side edge of the upper shielding case, through which the engaged portions 14' are engageable. In light of the above, the electromagnetic-wave shielding device of the other embodiment is different from the embodiment as previously discussed.

When assembling the pair of shielding cases 11 and 12 included in the above-mentioned other embodiment, the engaging portions 15' of the upper shielding case 11 are fitted to the engaged portions 14', while outwardly and elastically deforming the side walls 12c and 12d of the lower shielding case 12. At this time, the inner inclined wall surface of the engaged portion 14' of the lower shielding case 12 and the outer inclined wall surface of the engaging portion 15' of the upper shielding case 11 are abutted to each other, with the result that the upper and lower shielding cases 11 and 12 are snapped toward back each other by virtue of the elastic restoring force of the respective side walls 12c and 12d of the lower shielding case 12 as shown in FIG. 7(c), and as a result the pillar-shaped portions 16 and 17 can hold the printed circuit board 13 with a greater force as compared with the previously-explained embodiment, thus greatly enhancing the reliability with regard to the fitted condition of the pair of shielding cases 11 and 12, and to the electrical-contact relation between the ends of the pillar-shaped portions 16 and 17 and the respective ground terminals 23 and 24.

In case of each of the previously-explained embodiments, the electromagnetic-wave shielding device is exemplified in terms of a portable telephone. Of course, the device of each embodiment may be applied to the other electrical system having a high-frequency generating circuit, such as a cordless-type telephone, a transceiver or the like. Although the previously-noted electromagnetic-wave shielding device is exemplified as a device which shields unnecessary radiation of the high-frequency waves functioning as harmful electromagnetic waves, it will be appreciated that electromagnetic waves are not limited to high-frequency waves. The devices as discussed in the above-noted embodiments may be applied to such a case that harmful electromagnetic waves for example noise or the like are selected as a shielded object.

As will be appreciated from the above, in the case of the electromagnetic-wave shielding device made according to the present invention, the device comprises an engaged portion provided at one shielding case of the previously-noted pair of shielding cases, an engaging portion provided at the other shielding case of the pair of shielding cases and engaging with and disengaging from the engaged portion, and pillar-shaped portions being projected from opposing portions of the shielding cases for holding the printed circuit board between the pillar-shaped portions when the engaged portion of the one shielding case engages with the engaging portion of the other shielding case, wherein the printed circuit board held between the pillar-shaped portions is detachably accommodated in the pair of shielding cases, except a part connected to external electrical parts, and whereby undesired radiation of high-frequency waves generated from the printed circuit board can be absorbed within the pair of shielding cases, thus ensuring a good shielding effect. Also, easy assembling and dis-assembling can be attained, and additionally the entire size of the device can be small-sized.

What is claimed is:

1. An electromagnetic-wave shielding device for shielding radiation of electromagnetic waves generated by a printed circuit board having a pair of box-like shielding cases formed of electrically conductive material, said electromagnetic-wave shielding device comprising:

an engaged portion provided on a first shielding case of said pair of box-like shielding cases;

an engaging portion provided on a second shielding case of said pair of box-like shielding cases for engaging with and disengaging from said engaged portion; and a plurality of ground terminals formed at selected points on said printed circuit board;

a plurality of conductive pillar-shaped portions being projected from opposing portions of said pair of shielding cases and contacting said printed circuit board only at said selected points where said plurality of ground terminals are formed for holding said printed circuit board between said plurality of pillar-shaped portions when said engaged portion of said first shielding case engages with said engaging portion of said second shielding case and for making electrical contact with said plurality of ground terminals, wherein said printed circuit board held between said plurality of pillar-shaped portions is detachably accommodated within said pair of shielding cases.

2. The electromagnetic-wave shielding device as claimed in claim 1, wherein each of said plurality of pillar-shaped portions is formed with a cut-out at a respective end contacting a respective one of said plurality of said plurality of ground terminals, and wherein a coaxial cable wired on said printed circuit board is enclosed between said cut-out and an inside wall surface of a side wall of one of said pair of shielding cases, thereby holding said coaxial cable on said printed circuit board inside said pair of shielding cases.

3. The electromagnetic-wave shielding device as claimed in claim 1, further comprising a plurality of engaged portions and a plurality of engaging portions, wherein said engaged portions are integrally formed at each side of respective upper edges of a pair of side walls of said first shielding case of said pair of shielding cases, so that said engaged portions project inwardly from said respective upper edges, each of said engaged portions having an inner inclined wall surface being formed so that said inner inclined wall surface is inclined with respect to an inside wall surface of an associated one of said side walls of said first shielding case, and wherein said engaging portions to which said engaged portions are fitted are integrally formed at a pair of side walls of said second shielding case of said pair of shielding cases so that said engaging portions project outwardly from said side walls of said second shielding case, each of said engaging portions having an outer inclined wall surface being formed so that said outer inclined wall surface is inclined with respect to an outside wall surface of an associated one of said walls of said second shielding case.

* * * * *